(12) United States Patent
Karda et al.

(10) Patent No.: US 10,741,567 B2
(45) Date of Patent: Aug. 11, 2020

(54) MEMORY CELLS

(71) Applicant: Micron Technology, Inc., Boise, ID (US)

(72) Inventors: Kamal M. Karda, Boise, ID (US); Qian Tao, Boise, ID (US); Durai Vishak Nirmal Ramaswamy, Boise, ID (US); Haitao Liu, Boise, ID (US); Kirk D. Prall, Boise, ID (US); Ashonita Chavan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/284,475

(22) Filed: Feb. 25, 2019

(65) Prior Publication Data

US 2019/0189626 A1    Jun. 20, 2019

Related U.S. Application Data

(63) Continuation of application No. 15/861,286, filed on Jan. 3, 2018, now Pat. No. 10,217,753, which is a
(Continued)

(51) Int. Cl.
*H01L 27/00* (2006.01)
*H01G 4/33* (2006.01)
(Continued)

(52) U.S. Cl.
CPC ....... *H01L 27/11502* (2013.01); *H01G 4/008* (2013.01); *H01G 4/08* (2013.01);
(Continued)

(58) Field of Classification Search
CPC ......... H01L 27/11507; H01L 27/11502; H01L 27/10852; H01L 27/10805; H01L 28/40;
(Continued)

(56) References Cited

U.S. PATENT DOCUMENTS

| 4,070,653 A | 1/1978 | Rao et al. |
| 5,828,092 A | 10/1998 | Tempel |

(Continued)

FOREIGN PATENT DOCUMENTS

| CN | 104051231 | 9/2014 |
| CN | 201680050058.4 | 10/2019 |

(Continued)

OTHER PUBLICATIONS

Podgornyi et al., Leakage Currents in Thin Ferroelectric Films, 2012, Physics of the Solid State, 2012, vol. 54, No. 5, pp. 911-914, published on Dec. 2012.*

(Continued)

*Primary Examiner* — Nikolay K Yushin
(74) *Attorney, Agent, or Firm* — Wells St. John P.S.

(57) ABSTRACT

A memory cell includes a select device and a capacitor electrically coupled in series with the select device. The capacitor includes two conductive capacitor electrodes having ferroelectric material there-between. The capacitor has an intrinsic current leakage path from one of the capacitor electrodes to the other through the ferroelectric material. There is a parallel current leakage path from the one capacitor electrode to the other. The parallel current leakage path is circuit-parallel the intrinsic path and of lower total resistance than the intrinsic path. Other aspects are disclosed.

22 Claims, 4 Drawing Sheets

Related U.S. Application Data continuation of application No. 15/584,371, filed on May 2, 2017, now Pat. No. 9,887,204, which is a continuation of application No. 15/064,988, filed on Mar. 9, 2016, now Pat. No. 9,673,203, which is a continuation of application No. 14/623,749, filed on Feb. 17, 2015, now Pat. No. 9,305,929.

(51) Int. Cl.
| | |
|---|---|
| H01L 27/11502 | (2017.01) |
| H01L 27/11507 | (2017.01) |
| H01L 49/02 | (2006.01) |
| H01G 4/40 | (2006.01) |
| H01G 4/008 | (2006.01) |
| H01G 4/08 | (2006.01) |
| H01L 27/108 | (2006.01) |

(52) U.S. Cl.
CPC .............. *H01G 4/33* (2013.01); *H01G 4/40* (2013.01); *H01L 27/10852* (2013.01); *H01L 27/11507* (2013.01); *H01L 28/40* (2013.01); *H01L 28/75* (2013.01); *H01L 27/10805* (2013.01)

(58) Field of Classification Search
CPC ......... H01L 28/75; H01L 28/55; H01L 28/56; H01G 4/008; H01G 4/33; H01G 4/40; H01G 4/08
See application file for complete search history.

(56) References Cited

U.S. PATENT DOCUMENTS

| | | | | |
|---|---|---|---|---|
| 6,144,060 | A * | 11/2000 | Park | H01L 28/75 257/310 |
| 6,249,014 | B1 * | 6/2001 | Bailey | H01L 27/11502 257/295 |
| 6,337,496 | B2 * | 1/2002 | Jung | H01L 27/11502 257/295 |
| 6,611,014 | B1 * | 8/2003 | Kanaya | H01L 27/11502 257/295 |
| 6,635,528 | B2 * | 10/2003 | Gilbert | H01L 21/32139 257/E21.009 |
| 6,876,021 | B2 * | 4/2005 | Martin | H01L 27/11502 257/295 |
| 6,940,085 | B2 | 9/2005 | Fricke et al. | |
| 7,001,821 | B2 * | 2/2006 | Aggarwal | H01L 21/32139 257/295 |
| 7,180,141 | B2 * | 2/2007 | Eliason | H01L 27/11502 257/363 |
| 7,304,339 | B2 * | 12/2007 | Chen | |
| 7,408,212 | B1 | 8/2008 | Luan et al. | |
| 7,558,097 | B2 | 7/2009 | Khellah et al. | |
| 8,193,522 | B2 | 6/2012 | Li | |
| 8,212,256 | B2 * | 7/2012 | Chen | H01L 29/458 257/72 |
| 8,217,443 | B2 | 7/2012 | Izumi | |
| 8,969,170 | B2 | 3/2015 | Liebau et al. | |
| 9,761,715 | B2 | 9/2017 | Ramaswamy et al. | |
| 10,163,917 | B2 | 12/2018 | Ramaswamy | |
| 10,396,145 | B2 | 8/2019 | Balakrishnan et al. | |
| 2001/0040249 | A1 * | 11/2001 | Jung | H01L 27/11502 257/295 |
| 2001/0044205 | A1 * | 11/2001 | Gilbert | H01L 21/32139 438/653 |
| 2002/0036313 | A1 | 3/2002 | Yang et al. | |
| 2002/0102808 | A1 | 8/2002 | Pu et al. | |
| 2002/0119621 | A1 | 8/2002 | Lin | |
| 2003/0063740 | A1 * | 4/2003 | Shields | H04J 14/08 380/256 |
| 2003/0183867 | A1 | 10/2003 | Fricke et al. | |
| 2004/0099893 | A1 * | 5/2004 | Martin | H01L 27/11502 257/295 |
| 2004/0114428 | A1 | 6/2004 | Morikawa | |
| 2004/0129961 | A1 | 7/2004 | Paz De Araujo et al. | |
| 2004/0228172 | A1 | 11/2004 | Rinerson et al. | |
| 2005/0051822 | A1 | 3/2005 | Manning | |
| 2005/0101034 | A1 * | 5/2005 | Aggarwal | H01L 21/32139 438/3 |
| 2005/0167787 | A1 | 8/2005 | Fricke et al. | |
| 2006/0118841 | A1 * | 6/2006 | Eliason | H01L 27/11502 257/295 |
| 2006/0151771 | A1 | 7/2006 | Asano et al. | |
| 2006/0284228 | A1 | 12/2006 | Lee et al. | |
| 2008/0030110 | A1 | 2/2008 | Kumura et al. | |
| 2008/0266949 | A1 | 10/2008 | He et al. | |
| 2008/0273363 | A1 | 11/2008 | Mouli | |
| 2009/0016094 | A1 | 1/2009 | Rinerson et al. | |
| 2009/0026434 | A1 | 1/2009 | Malhotra et al. | |
| 2009/0078979 | A1 * | 3/2009 | Kumura | H01L 27/11502 257/295 |
| 2009/0153056 | A1 * | 6/2009 | Chen | H01L 29/458 315/51 |
| 2010/0129938 | A1 * | 5/2010 | Kumura | H01L 27/11502 438/3 |
| 2011/0080767 | A1 | 4/2011 | Rinerson et al. | |
| 2011/0147888 | A1 | 6/2011 | Steigerwald et al. | |
| 2011/0188281 | A1 | 8/2011 | Siau et al. | |
| 2012/0051137 | A1 | 3/2012 | Hung et al. | |
| 2014/0095853 | A1 | 4/2014 | Sarangshar | |
| 2014/0138753 | A1 | 5/2014 | Ramaswamy et al. | |
| 2014/0254276 | A1 | 9/2014 | Tokuhira et al. | |
| 2014/0332750 | A1 | 11/2014 | Ramaswamy et al. | |
| 2014/0346428 | A1 | 11/2014 | Sills et al. | |
| 2015/0028280 | A1 | 1/2015 | Sciarrillo et al. | |
| 2015/0054063 | A1 | 2/2015 | Karda et al. | |
| 2015/0249113 | A1 | 9/2015 | Takagi et al. | |
| 2015/0349255 | A1 | 12/2015 | Pellizzer et al. | |
| 2015/0357380 | A1 | 12/2015 | Pellizzer | |
| 2016/0020389 | A1 | 1/2016 | Ratnam et al. | |
| 2016/0240545 | A1 | 8/2016 | Karda et al. | |
| 2017/0186812 | A1 | 6/2017 | Lee et al. | |
| 2018/0269216 | A1 | 9/2018 | Lee | |
| 2019/0189357 | A1 | 6/2019 | Chavan et al. | |

FOREIGN PATENT DOCUMENTS

| | | |
|---|---|---|
| JP | 2009-283763 | 12/2009 |
| KR | 10-0799129 | 1/2008 |
| KR | 10-2008-0092812 | 10/2018 |
| WO | WO 2008/126961 | 12/2009 |

OTHER PUBLICATIONS

Schroedor et al., "Hafnium Oxide Based CMOS Compatible Ferroelectric Materials", 2013, ECS Journal of Solid State Science and Technology, vol. 2, (4), pp. N69-N72, published on Jan. 28, 2013.*

Ruitao et al, "Transition Metal Dichalcogenides and Beyond; Synthesis, Properties, and Applications of Single- and Few-layer Nanosheets", 2014, American Chemical Society, Am. Chem. Res, 2915, vol. 48, pp. 56-64, published on Dec. 9, 2014.*

Junlabhut et al. , "Optical Absorptivity Enhancement of SiO2 Thin Film by Ti and Ag Additive", 2013, Energy Procedia 34 ( 2013 ) 734-739, published Dec. 2013.*

13. Li et al., "Low-temperature magnetron sputter-deposition, hardness, and electrical resistivity of amorphous and crystalline alumina thin films", 2000, J. Vac. Sci. Technol. A 18 No5, pp. 2333-2338, Sep.-Oct. 2000.*

14. Katiyar et al., "Electrical properties of amorphous aluminum oxide thin films", 2005, Acta Materialia, vol. 55, pp. 2617-1622, Dec. 2005.*

Nigo et al., "Conduction band caused by oxygen vacancies an aluminum oxide for resistance random access memory", 2012, Journal of Applied Physics, vol. 112, pp. 033711-1-033711-6, published Aug. 7, 2012 (Year: 2012).*

Calderoni et al., U.S. Appl. No. 16/255,569, filed Jan. 23, 2019, titled "Methods of Incorporating Leaker-Devices into Capacitor Configurations to Reduce Cell Disturb, and Capacitor Configurations Incorporating Leaker-Devices", 47 pages.

(56) References Cited

OTHER PUBLICATIONS

Mutch et al., U.S. Appl. No. 16/507,826, filed Jul. 10, 2019, titled "Memory Cells and Methods of Forming a Capacitor Including Current Leakage Paths Having Different Total Resistances", 43 pages.

* cited by examiner

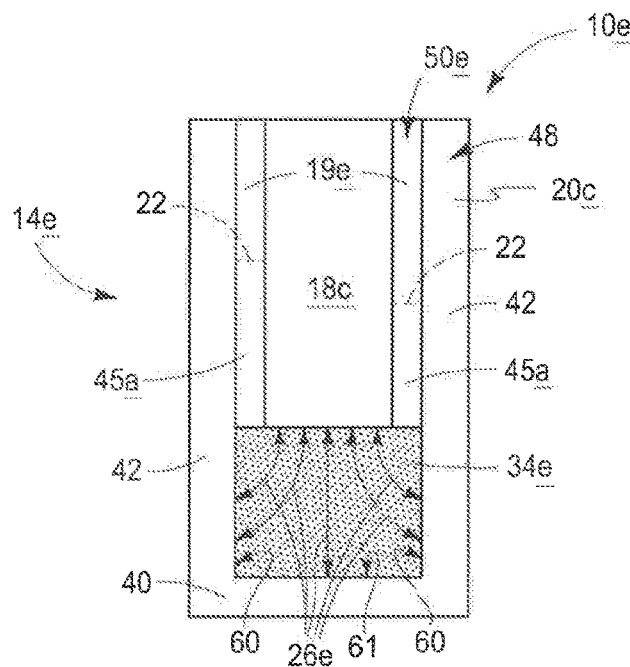
FIG. 8
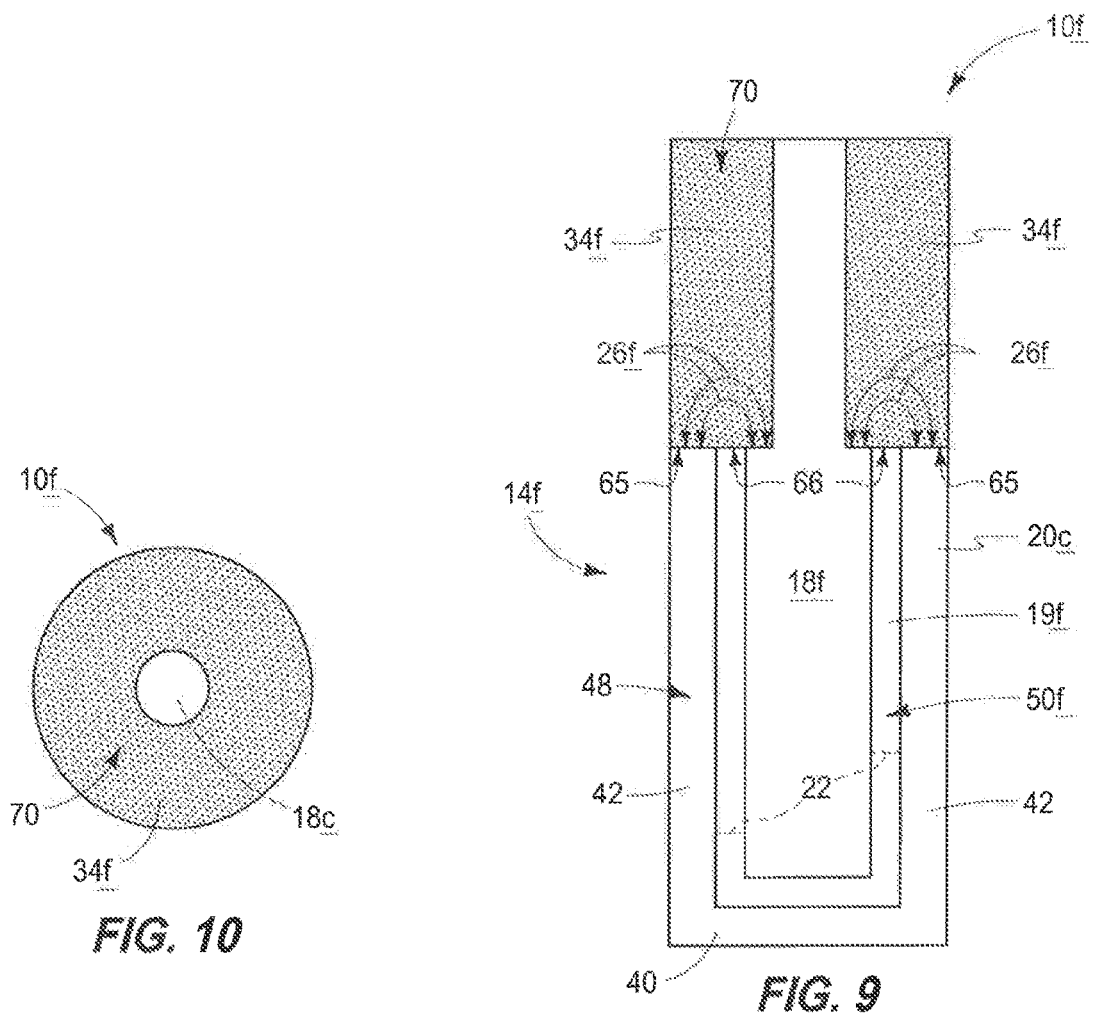
FIG. 10
FIG. 9

MEMORY CELLS

RELATED PATENT DATA

This patent resulted from a continuation application of U.S. patent application Ser. No. 15/861,286, filed Jan. 3, 2018, entitled "Memory Cells", naming Kamal M. Karda, Qian Tao, Durai Vishak Nirmal Ramaswamy, Haitao Liu, Kirk D. Prall, and Ashonita Chavan as inventors, which was a continuation application of U.S. patent application Ser. No. 15/584,371, filed on May 2, 2017, now U.S. Pat. No. 9,887,204, entitled "Memory Cells", naming Kamal M. Karda, Qian Tao, Durai Vishak Nirmal Ramaswamy, Haitao Liu, Kirk D. Prall, and Ashonita Chavan as inventors, which was a continuation application of U.S. patent application Ser. No. 15/064,988, filed Mar. 9, 2016, now U.S. Pat. No. 9,673,203, entitled "Memory Cells", naming Kamal M. Karda, Qian Tao, Durai Vishak Nirmal Ramaswamy, Haitao Liu, Kirk D. Prall, and Ashonita Chavan as inventors, which was a continuation application of U.S. patent application Ser. No. 14/623,749, filed Feb. 17, 2015, now U.S. Pat. No. 9,305,929, entitled "Memory Cells", naming Kamal M. Karda, Qian Tao, Durai Vishak Nirmal Ramaswamy, Haitao Liu, Kirk D. Prall, and Ashonita Chavan as inventors, the disclosures of which are incorporated by reference.

TECHNICAL FIELD

Embodiments disclosed herein pertain to memory cells.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. One type of capacitor is a ferroelectric capacitor which has ferroelectric material as at least part of the insulating material. Ferroelectric materials are characterized by having two stable polarized states. Polarization state of the ferroelectric material can be changed by application of suitable programming voltages, and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor.

One type of memory cell has a select device electrically coupled in series with a ferroelectric capacitor. Current typically leaks through the select device to adjacent substrate material even when the select device is idle (i.e., when inactive or "off"). This leads to voltage drop at the adjacent electrode of the ferroelectric capacitor, thus creating a voltage differential between the two capacitor electrodes. This results in an electric field being applied across the ferroelectric material when the memory cell is idle. Even if small, such an electric field may start to flip individual dipoles in the ferroelectric material and continue until all are flipped, thus erasing a programmed state of the memory cell. This can occur over a small amount of time, thereby destroying or preventing non-volatility in the memory cell.

BRIEF DESCRIPTION OF THE DRAWINGS

FIG. 8 is a diagrammatic sectional view of a portion of a memory cell in accordance with an embodiment of the invention.

FIG. 9 is a diagrammatic sectional view of a portion of a memory cell in accordance with an embodiment of the invention.

FIG. 10 is a top view of a memory cell of the FIG. 9 construction.

DETAILED DESCRIPTION OF EXAMPLE EMBODIMENTS

Figure 1:
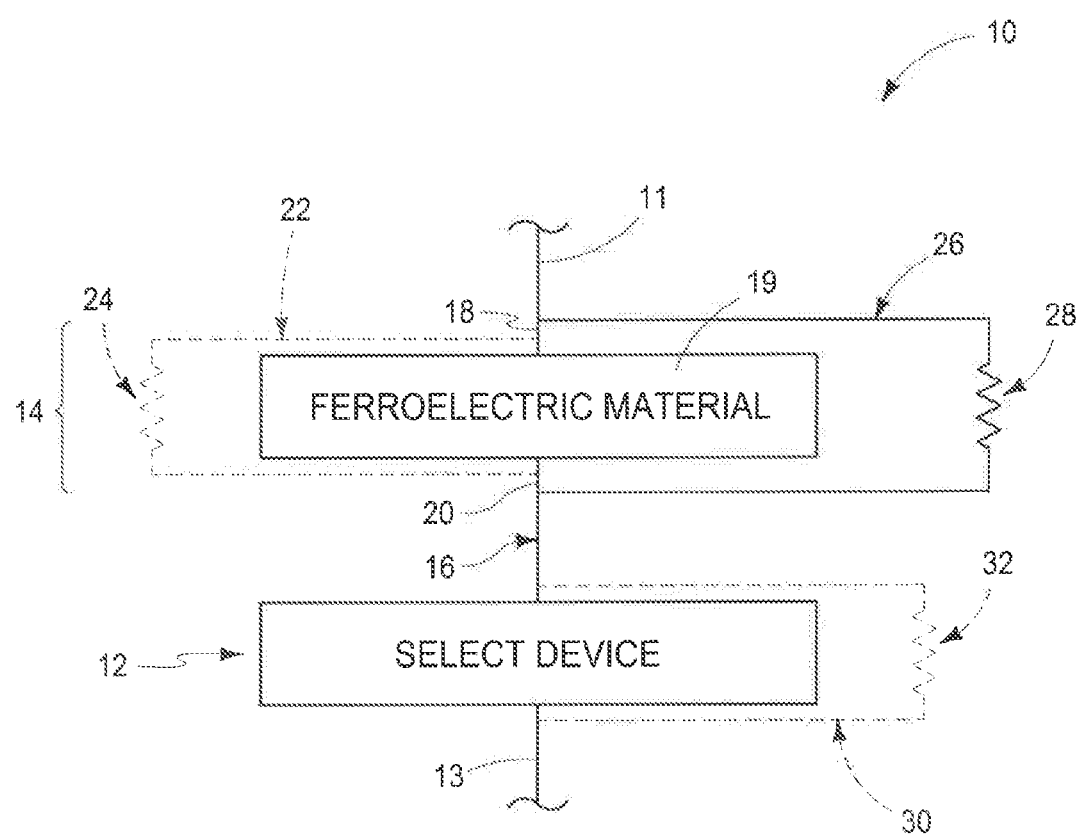
FIG. 1 is a schematic-like diagrammatic view of a memory cell in accordance with an embodiment of the invention.

A memory cell 10 in accordance with an embodiment of the invention is shown and initially described with reference to a schematic-like FIG. 1. Integrated circuitry (not shown) having memory cell 10 would likely have thousands or millions of such memory cells fabricated relative to a memory array or sub-array, and are not particularly material to the disclosure herein. Such arrays or sub-arrays would likely have a plurality of access lines and select lines having individual memory cells 10 there-between where such cross. Individual memory cells may be considered as comprising the portions of an individual access line and a crossing individual select line.

Memory cell 10 comprises a select device 12 and a capacitor 14 electrically coupled in series (i.e., circuit) with select device 12, for example by a conductive (i.e., electrically) path 16 as shown. Capacitor 14 in the depicted diagram may be considered as comprising two conductive capacitor electrodes 18 and 20 having ferroelectric material 19 there-between. Physically, path 16 may simply be a single electrode shared by capacitor 14 and select device 12. Capacitor 14 comprises an intrinsic current (i.e., electrical) leakage path from one of capacitor electrodes 18 or 20 to the other through ferroelectric material 19. Such intrinsic path is diagrammatically shown as a dashed line in a path 22 going around ferroelectric material 19 for clarity in FIG. 1. However in reality, path 22 would intrinsically/inherently be through ferroelectric material 19 to and between each of capacitor electrodes 18 and 20. Intrinsic path 22 will have some comparatively rather high overall/total resistance (i.e., electrical) which is diagrammatically indicated as a resistor 24 as device 14 in operation functions as a capacitor. Total resistance of resistor 24 will depend upon composition of ferroelectric material 19, thickness of ferroelectric material 19, and dipole orientation within ferroelectric material 19. Resistor 24 may inherently be a non-linear/variable resistor whereby its resistance is voltage dependent.

Memory cell 10 comprises a parallel (i.e., circuit-parallel) current leakage path 26 from one capacitor electrode 18 or 20 to the other. In one embodiment, parallel path 26 has a dominant band gap of 0.4 eV to 5.0 eV, and in one embodiment that is less than that of ferroelectric material 19. Such may be greater than dominant band gap of ferroelectric material 19 if parallel path 26 is sufficiently shorter in length than path 22. Regardless, in one embodiment parallel path 26 has some total resistance (e.g., shown as a resistor 28) that is lower than the total resistance of intrinsic path 22. By way of examples only, total resistance through intrinsic leakage path 22 may be $1 \times 10^{11}$–$1 \times 10^{18}$ ohms and total resistance through parallel leakage path 26 may be $1 \times 10^{9}$–$1 \times 10^{17}$ ohms.

Select device 12 may be any existing or yet-to-be-developed select device, including multiple devices. Examples include diodes, field effect transistors, and bipolar transistors. In operation, select device 12 will exhibit current leakage when the memory cell is idle (i.e., when the integrated circuitry associated with memory cell 10 is operationally "on", but no "read" or "write" operation of memory cell 10 is occurring). A select device current leakage path 30 exists, and is diagrammatically shown as a dashed line around select device 12, although such would be intrinsically/inherently through select device 12 or to underlying substrate (e.g, held at ground or other potential). Leakage path 30 is shown as having some total resistance 32. In one embodiment, parallel path 26 is configured so that current there-through when memory cell 10 is idle is greater than or equal to current leakage through path 30 when memory cell 10 is idle. Such will be dependent upon the construction and materials of select device 12, capacitor 14, parallel path 26, and upon voltages at various points within memory cell 10 in normal operation. Ideally, such enables voltage at electrodes 18 and 20 to be equal or at least very close to one another (e.g., within 50 millivolts) when idle whereby no or negligible electric field is created within ferroelectric material 19 when memory cell 10 is idle. For example and further, any voltage differential across the capacitor when idle ideally is such that any electric field in ferroelectric material 19 is at least 20 times lower than the intrinsic coercive field of ferroelectric field material 19. Such may preclude unintended dipole direction change within ferroelectric material 19. Alternately as examples, such may at least reduce risk of or increase time until unintended dipole direction change within ferroelectric material 19.

In one embodiment, resistor 28 in parallel path 26 is a non-linear resistor between capacitor electrodes 18 and 20 exhibiting overall higher resistance at higher voltages (e.g., between 1 to 5 Volts) than at lower voltages (e.g., less than 250 millivolts). Ideally, such a non-linear resistor is formed towards providing a greater magnitude of reduction of current leakage in parallel path 26 during higher voltage "read" and "write" operations as compared to when idle at lower voltage.

An access line and a select line (neither being shown) would likely be associated with memory cell 10. For example select device 12 may be a simple two terminal diode or other two terminal device. A cross point-like array construction may then be used whereby a conductive path 11 as part of capacitor electrode 18 connects with or is part of an access or select line (not shown) and a conductive path 13 as part of select device 12 connects with or is part of the other of an access or select line (not shown). As an alternate example, select device 12 may be a field effect transistor. Then, as an example, conductive path 11 may be part of a capacitor cell electrode 18 that is common to multiple capacitors 14 (not shown) within a memory array or sub-array, component 16 may be one source/drain region of the transistor, and component 13 may be the other. The gate (not shown) of the transistor may be a portion of an access line (not shown), and source/drain component 13 may connect with or be part of a sense line (not shown). Other architectures and constructions could alternately of course be used.

Figure 2:
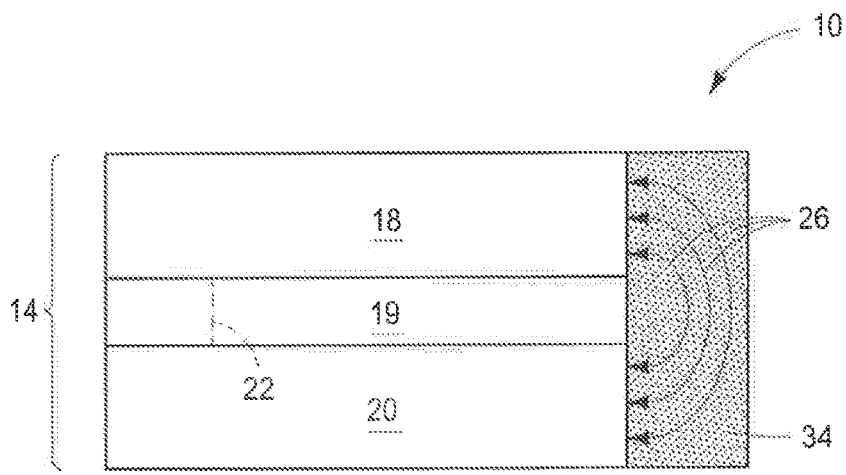
FIG. 2 is a diagrammatic sectional view of a portion of a memory cell in accordance with an embodiment of the invention.

FIG. 2 diagrammatically shows an example physical construction of a portion of a memory cell 10 comprising capacitor 14 and parallel current leakage path 26. Like numerals from the above-described embodiments have been used where appropriate, with some differences being indicated with different numerals. Select device 12 (not shown) may be electrically coupled to either one of capacitor electrodes 18 or 20. Materials will be aside, elevationally inward, and elevationally outward of memory cell construction 10. For example, other partially or wholly fabricated components of integrated circuitry may be provided somewhere about construction 10, and are not particularly germane to the inventions disclosed herein (apart from inclusion of any suitable select device 12 as shown in the FIG. 1 schematic).

Example conductive materials for capacitor electrodes 18 and 20 include one or more of elemental metal, an alloy of two or more elemental metals, conductive metal compounds, and conductively doped semiconductive material. Example ferroelectric materials 19 include ferroelectrics that have one or more of transition metal oxide, zirconium, zirconium oxide, hafnium, hafnium oxide, lead zirconium titanate, and barium strontium titanate, and may have dopant therein which comprises one or more of silicon, aluminum, lanthanum, yttrium, erbium, calcium, magnesium, strontium, and a rare earth element. Two specific examples are $Hf_xSi_yO_z$ and $Hf_xZr_yO_z$. Unless otherwise indicated, any of the materials and/or structures described herein may be homogenous or non-homogenous, and regardless may be continuous or discontinuous over any material which such overlie. Further, unless otherwise indicated, each material may be formed using any suitable existing or yet-to-be-developed technique, with atomic layer deposition, chemical vapor deposition, physical vapor deposition, epitaxial growth, diffusion doping, and ion implanting being examples. An example thickness for each of capacitor electrodes 18 and 20 is 25 to 300 Angstroms, while that for ferroelectric material 19 is 15 to 200 Angstroms. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials described herein may be of substantially constant thickness or of variable thicknesses. If of variable thickness, thickness refers to average thickness unless otherwise indicated.

Parallel path 26 is shown as being encompassed by or within a material 34. Example material 34 includes one or more of amorphous silicon, polycrystalline silicon, germanium, chalcogenide (e.g., metal dichalcogenides), silicon-rich silicon nitride, silicon-rich silicon oxide, and intrinsically dielectric material suitably doped with conductivity increasing dopants (e.g., $SiO_2$ and/or and $Si_3N_4$ doped with one or more of Ti, Ta, Nb, Mo, Sr, Y, Cr, Hf, Zr, and lanthanide series ions). Material 34, and thereby parallel path 26, may predominantly (i.e., more than 50 atomic %) comprise such material(s). Any of these materials may be doped or undoped to provide desired total resistance for current leakage flow there-through when memory cell 10 is idle. In one embodiment, material 34 is homogenous whereby parallel path 26 between capacitor electrodes 18 and 20 is homogenous. In one embodiment, material 34 is non-homogenous whereby parallel path 26 between capacitor electrodes 18 and 20 is non-homogenous. In an embodiment where material 34 and thereby parallel path 26 are non-homogenous, parallel path 26 may have multiple band gaps due to different composition materials therein having different band gaps. Yet, parallel path 26 will have a dominant (meaning controlling) band gap of 0.4 eV to 5.0 eV likely dependent on the respective volumes of the individual different materials within parallel path 26. Accordingly and regardless, "dominant" is used and applies herein regardless of homogeneity of the particular path/material. In one embodiment, dominant band gap of ferroelectric material 19 may be lower than that of parallel path 26. In one embodiment, minimum length of parallel path 26 is made longer than minimum thickness of ferroelectric material 19. As one example, such a length relationship may be used when density of states in the parallel path is equal to or greater than that in the ferroelectric material when dominant band gaps of the ferroelectric material and parallel path are about the same. As another example, such a length relationship may be used when density of states in the parallel path is equal to or greater than that in the ferroelectric material when dominant band gap of the ferroelectric material is less than that of the parallel path.

Figure 3:
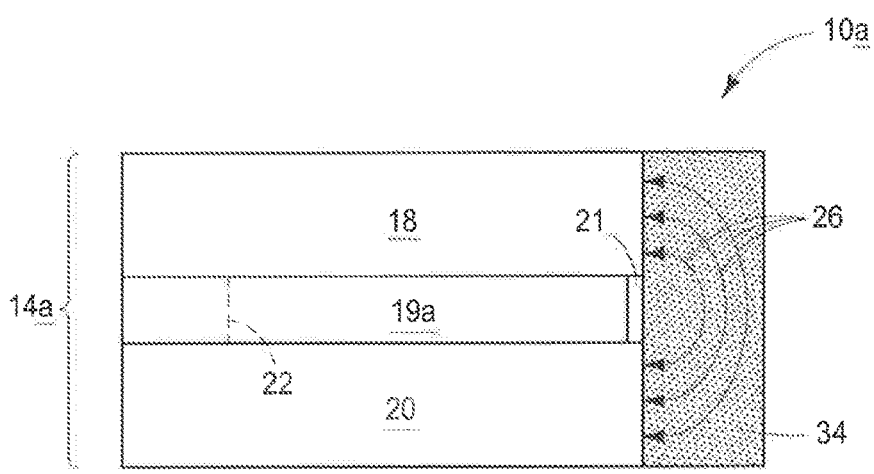
FIG. 3 is a diagrammatic sectional view of a portion of a memory cell in accordance with an embodiment of the invention.

In one embodiment and as shown in FIG. 2, material 34 and thereby parallel path 26 are directly against ferroelectric material 19. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. If two stated materials are not directly against one another, a material of different composition is there-between. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. FIG. 3 depicts an alternate embodiment memory cell 10a wherein parallel path 26 is not directly against ferroelectric material 19a. Like numerals from the above-described embodiments have been used where appropriate, with some construction differences being indicated with the suffix "a" or with different numerals. Capacitor 14a is shown as comprising some material 21 (e.g., dielectric material such as silicon dioxide and/or silicon nitride) spaced between materials 34 and 19a whereby parallel path 26 is not directly against ferroelectric material 19a. Any other attribute(s) or construction(s) as described above may be used.

Figure 4:
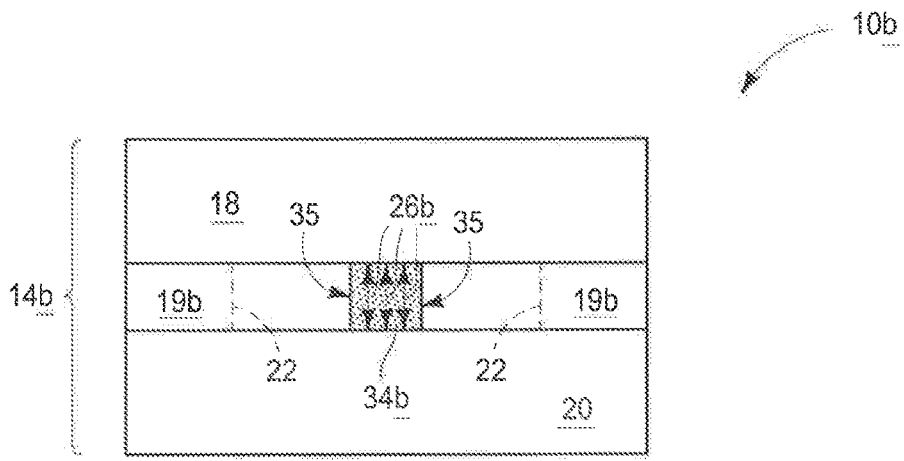
FIG. 4 is a diagrammatic sectional view of a portion of a memory cell in accordance with an embodiment of the invention.

FIG. 4 shows another example embodiment memory cell 10b. Like numerals from the above-described embodiments have been used where appropriate, with some construction differences being indicated with the suffix "b" or different numerals. Material 34b in memory cell 10b (and thereby parallel path 26b) is essentially shown as passing through ferroelectric material 19b, thereby constituting an internal part of capacitor construction 14b and having two lateral sides 35 (i.e., in at least one straight-line cross section) each of which is directly against ferroelectric material 19b. Any other attribute(s) or construction(s) as described above may be used.

The parallel current leakage path may have minimum length which is equal to, more than, or less than minimum thickness of the ferroelectric material between the two capacitor electrodes. In one embodiment, the parallel path has minimum length within 5% of minimum thickness of the ferroelectric material between the two capacitor electrodes. FIGS. 2-4 essentially show parallel path 26 as having minimum length that is substantially equal to minimum thickness of ferroelectric material 19/19a/19b. For example even in the FIG. 2 and FIG. 3 embodiments, the shortest path (e.g., minimum length) through material 34 is from the lowest right corner of material of capacitor electrode 18 to the uppermost right corner of material of electrode 20 even though for clarity in FIGS. 2 and 3 parallel path 26 is diagrammatically shown as a wide arcuate-path through material 34. In some embodiments, the parallel path may have minimum length greater than minimum thickness of the ferroelectric material between the two capacitor electrodes, in one embodiment being within 30% thereof, and in one embodiment being at least twice thereof.

Figure 5:
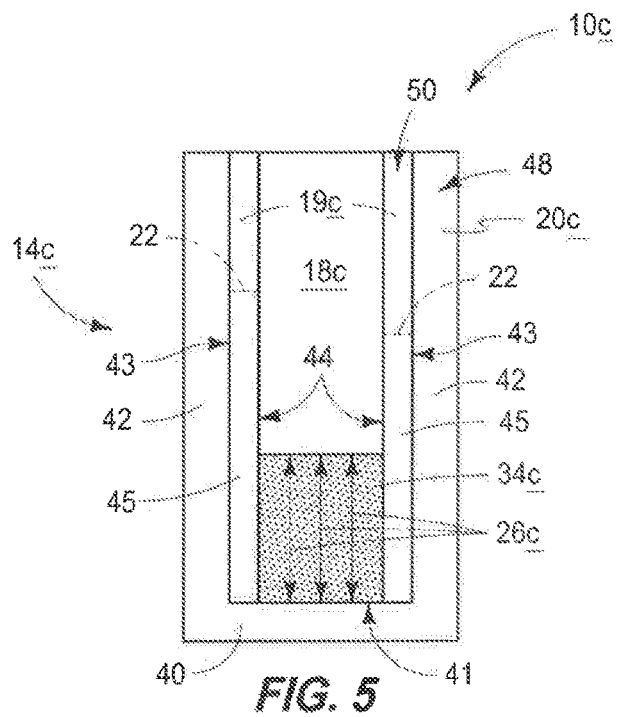
FIG. 5 is a diagrammatic sectional view of a portion of a memory cell in accordance with an embodiment of the invention.
Figure 6:
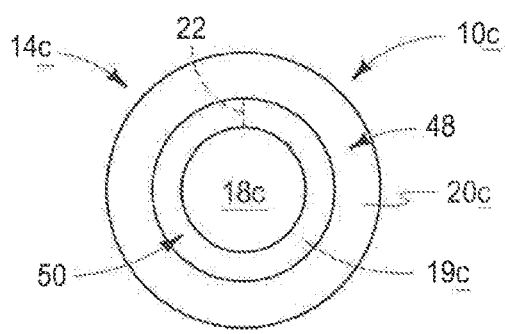
FIG. 6 is a top view of a memory cell of the FIG. 5 construction.

Another example embodiment memory cell 10c is shown in FIGS. 5 and 6. Like numerals from the above-described embodiments have been used where appropriate, with some construction differences being indicated with the suffix "c" or with different numerals. Capacitor 14c comprises first conductive capacitor electrode 20c having a base 40 and laterally-spaced (i.e., in at least one straight-line cross section) walls 42 extending there-from. Laterally-spaced walls 42 have facing side surfaces 43. Second conductive capacitor electrode 18c is laterally between walls 42 of first capacitor electrode 20c. Ferroelectric material 19c is laterally between walls 42 of first capacitor electrode 20c and laterally between second capacitor electrode 18c and first capacitor electrode 20c. In one embodiment, ferroelectric material 19c comprises laterally-spaced walls 45 (FIG. 5) having side surfaces 44. Capacitor 14c comprises intrinsic current leakage path 22 from one of first and second capacitor electrodes 20c and 18c to the other through ferroelectric material 19c.

A parallel current leakage path 26c is between second capacitor electrode 18c and a surface 41 of base 40 of first capacitor electrode 20c. Parallel path 26 is circuit-parallel intrinsic path 22 and of lower total resistance than intrinsic path 22. In one embodiment, parallel path 26c is within and through a material 34c having a dominant band gap of 0.4 eV to 5.0 eV, and in one embodiment that is less than band gap of ferroelectric material 19c. FIG. 5 shows an example embodiment wherein minimum length of parallel path 26c is more than twice as great as minimum thickness of ferroelectric material 19c. In one embodiment, material 34c is directly against surface 41 of base 40 of first capacitor electrode 42. In one embodiment, material 34c is directly against side surfaces 44 of laterally-spaced walls 45 of ferroelectric material 19c. A select device 12 (not shown) would be electrically coupled in series with capacitor 14c, specifically, being electrically coupled in series with one of first capacitor electrode 20c or second capacitor electrode 18c. In one embodiment and as shown, material 34c is not directly against side surfaces 43 of laterally-spaced walls 42 of first capacitor electrode 20c. In one embodiment and as shown, first capacitor electrode 20c comprises an annulus 48, and in one embodiment ferroelectric material 19c comprises an annulus 50. Any other attribute(s) or construction(s) as described above may be used.

Any suitable technique may be used for making the FIGS. 5 and 6 construction. As an example, first capacitor electrode 20c and ferroelectric material 19c may be formed as respective linings within an opening in dielectric material (not shown). Then, ferroelectric material 19c may be anisotropically etched through its base to produce the material 19c construction as shown in FIG. 5. Material 34c may then be deposited and etched back to produce its construction as shown in FIG. 5, followed by deposition and polish-back or etch-back of material 18c.

Figure 7:
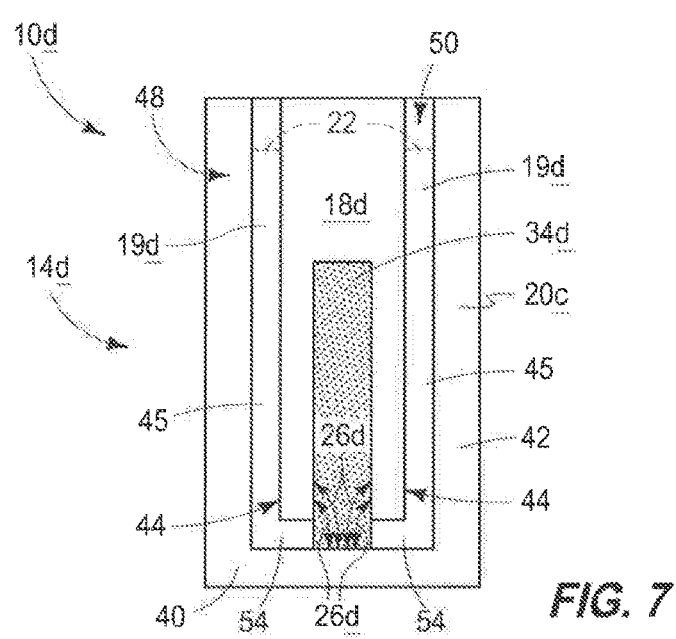
FIG. 7 is a diagrammatic sectional view of a portion of a memory cell in accordance with an embodiment of the invention.

FIG. 7 depicts an alternate embodiment memory cell 10d to that shown by FIGS. 5 and 6. Like numerals from the above-described embodiments have been used where appropriate, with some construction differences being indicated with the suffix "d" or with different numerals. Ferroelectric material 19d has a base 54 from which laterally-spaced walls 45 extend. Material 34d extends through base 54 of ferroelectric material 19d. In one embodiment and as shown, material 34d is not directly against lateral side surfaces 44 of laterally-spaced walls 45 of ferroelectric material 19d. A select device 12 (not shown) would be electrically coupled in series with capacitor 14d, specifically to one of capacitor electrodes 18d or 20c. Any suitable technique may of course be used for making the FIG. 7 construction. For example, first capacitor electrode 20c and ferroelectric material 19d may be formed as respective linings within an opening in dielectric material (not shown). Then, material 18d may initially be formed as a lining within the remaining opening having ferroelectric material 19d as its sidewalls, and leaving a void-space having lateral width equal to that of material 34d. The material 18d lining may then be anisotropically etched through its base. This is followed by etching through the base of ferroelectric material 19d to material 20c to produce the final construction of material 19d shown in FIG. 7. Material 34d may then be deposited and etched back to produce its final construction, followed by deposition and polish-back or etch-back of remaining material 18d. Any other attribute(s) or construction(s) as described above may be used.

Another embodiment memory cell 10e is shown in FIG. 8. Like numerals from the above-described embodiments have been used where appropriate, with some construction differences being indicated with the suffix "e" or with different numerals. First capacitor electrode 20c has laterally-spaced walls 42 regardless of whether having a base 40. Parallel current leakage path 26e within material 34e is between second capacitor electrode 18c and a surface 60 of laterally-spaced walls 42 of first capacitor electrode 20c. In one embodiment and as shown, surface 60 comprises a lateral side surface of laterally-spaced walls 42 of first capacitor electrode 20c. Regardless, in one embodiment and as shown, material 34e is directly against surface 60 of walls 42 of first capacitor electrode 20c. In one embodiment where first capacitor electrode 20c has a base 40 from which laterally-spaced walls 42 extend, material 34e may be directly against a surface 61 of base 40 of first capacitor electrode 20c. A select device 12 (not shown) would be electrically coupled in series with capacitor 14e, specifically to one of capacitor electrodes 18c or 20c. Any suitable technique may of course be used for making the FIG. 8 construction. For example, first capacitor electrode 20c may be formed as a lining within an opening in dielectric material (not shown). Material 34e may then be deposited and etched back to produce its construction as shown in FIG. 8. This may be followed by deposition of ferroelectric material 19e as a lining within the remaining opening, and subsequently anisotropically etching it through the base of material 19e. Material 18c may then be deposited and polished or etched back to its depicted final construction. Any other attribute(s) or construction(s) as described above may be used.

Another embodiment memory cell 10f is shown in FIGS. 9 and 10. Like numerals from the above-described embodiments have been used where appropriate, with some construction differences being indicated with the suffix "f" or with different numerals. Memory cell 10f is somewhat similar to memory cell 10e in that a parallel current leakage path 26f is between second capacitor electrode 18f and a surface of laterally-spaced walls 42 of first capacitor electrode 20c. However in memory cell 10f, such surface comprises an elevationally outermost surface 65 of laterally-spaced walls 42 of first capacitor electrode 20c. Further in one embodiment and as shown, material 34f is directly against an elevationally outermost surface 66 of ferroelectric material 19f. Further in one embodiment and as shown, material 34f comprises an annulus 70. Any suitable technique may of course be used for making the FIGS. 9 and 10 construction. For example, first capacitor electrode 20c and ferroelectric material 19f may be formed as respective linings within an opening in dielectric material (not shown). Material 18f may then be deposited to fill the remaining opening having ferroelectric material 19f as its sidewalls. Then, materials 20c, 19f, and 18f may be collectively etched or polished back to the elevation of surfaces 65 and 66. Material 34f may then be deposited as a lining within the remaining opening and subsequently anisotropically etching material 34f through its base to produce its final construction as shown in FIGS. 9 and 10. Remaining material 18f may then be deposited and polished or etched back to its depicted final construction. Any other attribute(s) or construction(s) as described above may be used.

In one embodiment, a memory cell (e.g., 10e or 10f) has a first capacitor electrode 20c comprising an annulus 48. Second capacitor electrode 18c/18f is radially within annulus 48 of first capacitor electrode 20c. Ferroelectric material 19e/19f is radially within annulus 48 of first capacitor electrode 20c. Capacitor 14e/14f comprises an intrinsic current leakage path 22 from one of the first and second capacitor electrodes to the other through ferroelectric material 19e/19f. Parallel current leakage path 26e/26f is between second capacitor electrode 18c/18f and a surface of annulus 48 of first capacitor electrode 20c. Parallel path 26e/26f is circuit-parallel intrinsic path 22 and of lower electric total resistance than intrinsic path 22.

In one embodiment, material 34f comprises an annulus 70. In one embodiment, material 34f is directly against an elevationally outermost surface 65 of annulus 48. In one embodiment, ferroelectric material 19f comprises an annulus 50f and material 34f is directly against an elevationally outmost surface 66 of annulus 50f. Any other attribute(s) or construction(s) as described above may be used.

CONCLUSION

In some embodiments, a memory cell comprises a select device and a capacitor electrically coupled in series with the select device. The capacitor comprises two conductive capacitor electrodes having ferroelectric material there-between. The capacitor comprises an intrinsic current leakage path from one of the capacitor electrodes to the other through the ferroelectric material. There is a parallel current leakage path from the one capacitor electrode to the other. The parallel current leakage path is circuit-parallel the intrinsic path and of lower total resistance than the intrinsic path.

In some embodiments, a memory cell comprises a select device and a capacitor electrically coupled in series with the select device. The capacitor comprises two conductive capacitor electrodes having ferroelectric material there-between. The capacitor comprises an intrinsic current leakage path from one of the capacitor electrodes to the other through the ferroelectric material. There is a parallel current leakage path from the one capacitor electrode to the other. The parallel current leakage path is circuit-parallel the intrinsic path and has a dominant band gap of 0.4 eV to 5.0 eV.

In some embodiments, a memory cell comprises a select device and a capacitor electrically coupled in series with the select device. The capacitor comprises a first conductive capacitor electrode having a base and laterally-spaced walls extending there-from. A second conductive capacitor electrode is laterally between the walls of the first capacitor electrode. A ferroelectric material is laterally between the walls of the first capacitor electrode and laterally between the second capacitor electrode and the first capacitor electrode. The capacitor comprises an intrinsic current leakage path from one of the first and second capacitor electrodes to the other through the ferroelectric material. There is a parallel current leakage path is between the second capacitor electrode and a surface of the base of the first capacitor electrode. The parallel current leakage path is circuit-parallel the intrinsic path and of lower total resistance than the intrinsic path.

In some embodiments, a memory cell comprises a select device and a capacitor electrically coupled in series with the select device. The capacitor comprises a first conductive capacitor electrode having laterally-spaced walls. A second conductive capacitor electrode is laterally between the walls of the first capacitor electrode. Ferroelectric material is laterally between the walls of the first capacitor electrode and laterally between the second capacitor electrode and the first capacitor electrode. The capacitor comprises an intrinsic current leakage path from one of the first and second capacitor electrodes to the other through the ferroelectric material. There is a parallel current leakage path between the second capacitor electrode and a surface of the laterally-spaced walls of the first capacitor electrode. The parallel current leakage path is circuit-parallel the intrinsic path and of lower total resistance than the intrinsic path.

In some embodiments, a memory cell comprises a select device and a capacitor electrically coupled in series with the select device. The capacitor comprises a first conductive capacitor electrode comprising an annulus. A second conductive capacitor electrode is radially within the annulus of the first capacitor electrode. Ferroelectric material is radially within the annulus of the first capacitor electrode between the second capacitor electrode and the first capacitor electrode. The capacitor comprises an intrinsic current leakage path from one of the first and second capacitor electrodes to the other through the ferroelectric material. There is a parallel current leakage path is between the second capacitor electrode and a surface of the annulus of the first capacitor electrode. The parallel current leakage path is circuit-parallel the intrinsic path and of lower total resistance than the intrinsic path.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:
1. A memory cell, comprising:
a select device; and
a capacitor coupled to the select device, the capacitor comprising a first electrode and a second electrode, the capacitor having a first current leakage path between the first electrode and the second electrode through ferroelectric material, the first current leakage path having a first total resistance, the capacitor having a second current leakage path between the first electrode and the second electrode through an amorphous semiconducting material, the second current leakage path having a second total resistance that is less than the first total resistance, the ferroelectric material comprising one or more materials selected from the group consisting of zirconium, zirconium oxide, hafnium, barium strontium titanate, $Hf_xSi_yO_z$ and $Hf_xZr_yO_z$; and wherein the one or more materials is optionally doped with a dopant comprising one or more member of the group consisting of silicon, aluminum, lanthanum, yttrium, erbium, calcium, magnesium, strontium and rare earth elements.

2. The memory cell of claim 1 wherein the ferroelectric material comprises a hafnium-based ferroelectric material.

3. The memory cell of claim 1 wherein the amorphous semiconducting material comprises amorphous silicon.

4. The memory cell of claim 1 wherein a minimum length of the second current leakage path is within 95% to 105% of a minimum thickness of the ferroelectric material.

5. The memory cell of claim 1 wherein the ferroelectric material has a thickness from 15 to 200 Angstroms.

6. The memory cell of claim 1 wherein a voltage differential across the capacitor while idle is such that an electric field in the ferroelectric material is at least 20 times lower than the intrinsic coercive field of the ferroelectric material.

7. The memory cell of claim 1 wherein the select device exhibits currents leakage while the memory cell is idle, the second current leakage path being configured so that current there-through while the memory cell is idle is greater than or equal to said current leakage of the select device while the memory cell is idle.

8. The memory cell of claim 7 wherein the second current leakage path is configured so that current there-through while the memory cell is idle is no more than one nanoampere.

9. A memory cell, comprising:
   a select device; and
   a capacitor coupled to the select device, the capacitor comprising a first electrode and a second electrode, the capacitor having a first current leakage path between the first electrode and the second electrode through ferroelectric material, the first current leakage path having a first total resistance, the capacitor having a second current leakage path between the first electrode and the second electrode through germanium, the second current leakage path having a second total resistance that is less than the first total resistance, the ferroelectric material comprising one or more materials selected from the group consisting of zirconium, zirconium oxide, hafnium, barium strontium titanate, $Hf_xSi_yO_z$ and $Hf_xZr_yO_{zj}$ and wherein the one or more materials is optionally doped with a dopant comprising one or more member of the group consisting of silicon, aluminum, lanthanum, yttrium, erbium, calcium, magnesium, strontium and rare earth elements.

10. The memory cell of claim 9 wherein the ferroelectric material comprises a hafnium-based ferroelectric material.

11. The memory cell of claim 9 wherein a voltage differential across the capacitor while idle is such that an electric field in the ferroelectric material is at least 20 times lower than the intrinsic coercive field of the ferroelectric material.

12. The memory cell of claim 9 wherein the select device exhibits currents leakage while the memory cell is idle, the second current leakage path being configured so that current there-through while the memory cell is idle is greater than or equal to said current leakage of the select device while the memory cell is idle.

13. A memory cell, comprising:
   a select device; and
   a capacitor coupled to the select device, the capacitor comprising a first electrode and a second electrode, the capacitor having a first current leakage path between the first electrode and the second electrode through ferroelectric material, the first current leakage path having a first total resistance, the capacitor having a second current leakage path between the first electrode and the second electrode through metal dichalcogenide, the second current leakage path having a second total resistance that is less than the first total resistance, the ferroelectric material comprising one or more materials selected from the group consisting of zirconium, zirconium oxide, hafnium, barium strontium titanate, $Hf_xSi_yO_z$ and $Hf_xZr_yO_z$; and wherein the one or more materials is optionally doped with a dopant comprising one or more member of the group consisting of silicon, aluminum, lanthanum, yttrium, erbium, calcium, magnesium, strontium and rare earth elements.

14. The memory cell of claim 13 wherein a voltage differential across the capacitor while idle is such that an electric field in the ferroelectric material is at least 20 times lower than the intrinsic coercive field of the ferroelectric material.

15. The memory cell of claim 13 wherein the select device exhibits currents leakage while the memory cell is idle, the second current leakage path being configured so that current there-through while the memory cell is idle is greater than or equal to said current leakage of the select device while the memory cell is idle.

16. A memory cell, comprising:
   a select device; and
   a capacitor coupled to the select device, the capacitor comprising a first electrode and a second electrode, the capacitor having a first current leakage path between the first electrode and the second electrode through ferroelectric material, the first current leakage path having a first total resistance, the capacitor having a second current leakage path between the first electrode and the second electrode through one or more of silicon-rich silicon nitride and silicon-rich silicon oxide, the second current leakage path having a second total resistance that is less than the first total resistance, the ferroelectric material comprising one or more materials selected from the group consisting of zirconium, zirconium oxide, hafnium, barium strontium titanate, $Hf_xSi_yO_z$ and $Hf_xZr_yO_z$; and wherein the one or more materials is optionally doped with a dopant comprising one or more member of the group consisting of silicon, aluminum, lanthanum, yttrium, erbium, calcium, magnesium, strontium and rare earth elements.

17. The memory cell of claim 16 wherein the second current leakage path comprises the silicon-rich silicon nitride.

18. The memory cell of claim 16 wherein the second current leakage path comprises the silicon-rich silicon oxide.

19. The memory cell of claim 16 wherein the second current leakage path comprises the silicon-rich silicon nitride and silicon-rich silicon oxide.

20. A memory cell, comprising:
   a select device; and
   a capacitor coupled to the select device, the capacitor comprising a first electrode and a second electrode, the capacitor having a first current leakage path between the first electrode and the second electrode through ferroelectric material, the first current leakage path having a first total resistance, the capacitor having a second current leakage path between the first electrode and the second electrode through intrinsically dielectric material comprising at least one of $SiO_2$ and $Si_3N_4$ doped with one or more of Ti, Ta, Nb, Mo, Sr, Y, Cr, Hf, Zr, and lanthanide series ions, the second current leakage path having a second total resistance that is less than the first total resistance, the ferroelectric material comprising one or more materials selected from the group consisting of zirconium, zirconium oxide, hafnium, barium strontium titanate, $Hf_xSi_yO_z$ and $Hf_xZr_yO_z$; and wherein the one or more materials is optionally doped with a dopant comprising one or more member of the group consisting of silicon, aluminum, lanthanum, yttrium, erbium, calcium, magnesium, strontium and rare earth elements.

21. The memory cell of claim 20 wherein a voltage differential across the capacitor while idle is such that any electric field in the ferroelectric material is at least 20 times lower than the intrinsic coercive field of the ferroelectric material.

22. The memory cell of claim 20 wherein the select device exhibits currents leakage while the memory cell is idle, the second current leakage path being configured so that current there-through while the memory cell is idle is greater than or equal to said current leakage of the select device while the memory cell is idle.

* * * * *